United States Patent
Shimizu et al.

(10) Patent No.: US 7,115,953 B2
(45) Date of Patent: Oct. 3, 2006

(54) SEMICONDUCTOR DEVICE AND METHOD OF MANUFACTURING SEMICONDUCTOR DEVICE

(75) Inventors: Tatsuo Shimizu, Tokyo (JP); Takeshi Yamaguchi, Kawasaki (JP); Yukie Nishikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/049,661

(22) Filed: Feb. 4, 2005

(65) Prior Publication Data

US 2005/0230759 A1  Oct. 20, 2005

(30) Foreign Application Priority Data

Mar. 31, 2004 (JP) .............................. 2004-108050

(51) Int. Cl.
   *H01L 29/72* (2006.01)
(52) U.S. Cl. ...................................... 257/368
(58) Field of Classification Search ................ 257/368
   See application file for complete search history.

(56) References Cited

FOREIGN PATENT DOCUMENTS

JP  2002-100766  4/2002

OTHER PUBLICATIONS

Norton et al, "Strontium silicide termination and silicate epitaxy on (oo1) Si", J. Vac. Sci. Technol. B 20(1), Jan./Feb. 2002.*
Hiroyuki Mori, et al.; "Epitaxial Growth of SrTiO₃ Films on Si(100) Substrates Using a Focused Electron Beam Evaporation Method"; Japanese Journal of Applied Physics; vol. 30, No. 8A; pp. L1415-L1417; (Aug. 1991).
Bum Ki Moon, et al.; "Roles of Buffer Layers in Epitaxial Growth of SrTiO₃ Films on Silicon Substrates"; Japanese Journal of Applied Physics; vol. 33 (1994); Part 1, No. 3A; pp. 1472-1477; (Mar. 1994).
Z. Yu, et al.; "Epitaxial oxide thin films on Si(001)"; J. Vac. Sci. Technol. B 18(4); pp. 2139-2145; (Jul./Aug. 2000).
R. A. McKee, et al.; "Physical Structure and Inversion Charge at a Semiconductor Interface with a Crystalline Oxide"; SCIENCE; vol. 293, pp. 468-471; (Jul. 20, 2001).
Sanghun Jeon, et al.; "Epitaxial SrTiO₃ on Silicon with EOT of 5.4Å for MOS Gate Dielectric Applications"; IEDM Technical Digest; pp. 955-957; (2002).
R. A. McKee, et al.; "Crystalline Oxides on Silicon: The First Five Monolayers"; Physical Review Letters; vol. 81, No. 14; pp. 3014-3017; (Oct. 5, 1998).
Akihiko Hirata, et al.; "Strontium and SrO epitaxy on hydrogen-terminated Si(111)"; Appl. Phys. Lett. 65 (25); pp. 3182-3184; (Dec. 19, 1994).
D. P. Norton, et al.; "Strontium silicide termination and silicate epitaxy on (001) Si"; J. Vac. Sci. Technol. B 20(1); 2002; (Jan./Feb. 2002).
Evers et al., "Electrical Properties of Alkaline Earth Disilicides and Digermanides," Mater. Res. Bull. (USA), vol. 9, No. 5, pp. 549-553, May 1974.

(Continued)

*Primary Examiner*—Edward Wojciechowicz
(74) *Attorney, Agent, or Firm*—Finnegan, Henderson, Farabow, Garrett & Dunner, L.L.P.

(57) ABSTRACT

A semiconductor device includes a semiconductor substrate containing Si as a main component, and an active element formed on the semiconductor substrate and including an insulating metal silicide thin film formed on the semiconductor substrate, dangling bonds of Si of the semiconductor substrate being terminated by the insulating metal silicide thin film.

18 Claims, 1 Drawing Sheet

OTHER PUBLICATIONS

Hiroyuki Mori, et al.; "Epitaxial Growth of $SrTiO_3$ Films on Si(100) Substrates Using a Focused Electron Beam Evaporation Method"; Japanese Journal of Applied Physics; vol. 30, No. 8A; pp. L1415-L1417; (Aug. 1991).

Bum Ki Moon, et al.; "Roles of Buffer Layers in Epitaxial Growth of $SrTiO_3$ Films on Silicon Substrates"; Japanese Journal of Applied Physics; vol. 33 (1994); Part 1, No. 3A; pp. 1472-1477; (Mar. 1994).

Z. Yu, et al.; "Epitaxial oxide thin films on Si(001)"; J. Vac. Sci. Technol. B 18(4); pp. 2139-2145; (Jul./Aug. 2000).

R.A. McKee, et al.; "Physical Structure and Inversion Charge at a Semiconductor Interface with a Crystalline Oxide"; SCIENCE; vol. 293, pp. 468-471; (Jul. 20, 2001).

Sanghun Jeon, et al.; "Epitaxial $SrTiO_3$ on Silicon with EOT of 5.4A for MOS Gate Dielectric Applications"; IEDM Technical Digest; pp. 955-957; (2002).

R.A. McKee, et al.; "Crystalline Oxides on Silicon: The First Five Monolayers"; Physical Review Letters; vol. 81, No. 14; pp. 3014-3017; (Oct. 5, 1998).

Akihiko Hirata, et al.; "Strontium and SrO epitaxy on hydrogen-terminated Si(111)"; Appl. Phys. Lett. 65 (25); pp. 3182-3184; (Dec. 19, 1994).

D.P. Norton, et al.; "Strontium silicide termination and silicate epitaxy on (001) SI"; J. Vac. Sci. Technol. B 20(1); 2002; (Jan./Feb. 2002).

* cited by examiner

F I G. 1

F I G. 2

F I G. 3

US 7,115,953 B2

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-108050, filed Mar. 31, 2004, the entire contents of which are incorporated herein by reference.

BACKGROUND OF THE INVENTION

1. Field of the Invention

The present invention relates to a semiconductor device, for example, a metal-insulator-semiconductor (MIS) field-effect transistor, a semiconductor device having a structure in which a dangling bonds of a semiconductor are terminated by an insulating metal silicide thin film formed on a semiconductor substrate, and a method of manufacturing the semiconductor device.

2. Description of the Related Art

There has been a demand for thinning of a gate insulating film for miniaturization of an ultra large scale integration (ULSI) device or reduction of power consumption. The gate insulating film has heretofore been thinned in order to increase a capacitance and thereby secure an electric charge amount induced in a channel of a field-effect transistor (FET). As a result, the thinning of an $SiO_2$ film, which is a gate oxide film, has been propelled, and the film has almost reached a thickness largely below 1 nm at present.

In the $SiO_2$ film, a gate leakage current has increased to such an extent that the power consumption cannot be suppressed because of standby power dissipation. For example, even when the $SiO_2$ film has a film thickness of 0.8 nm, MOSFET normally operates, but the gate leakage current reaches 1 kA/$cm^2$, and the problem in the power consumption has become remarkably pronounced.

From a viewpoint how the power consumption be reduced, it is effective to increase an actual film thickness. Therefore, attempts to secure the charge amount with a film thicker than the $SiO_2$ film by the use of a high-dielectric-constant material, so-called high-K dielectrics have been actively studied. There are many oxides as high-dielectric-constant stable materials, and they have been developed as insulating films. At present, as an especially prospective material, there has been HfSiON or the like. However, when high-dielectric-constant oxide is directly formed into a film on an Si substrate, a low-dielectric-constant layer is generated in an interface in the process of film formation or a subsequent high-temperature process. There is a demand for a film thickness, as an equivalent $SiO_2$ film thickness (EOT), of 0.5 nm or less in the future, so that the generation of the low-dielectric-constant layer can be said to be fatal.

Moreover, with regard to the interface, defect density has a very important meaning. That is, when there are defects in the interface, movements of electrons or holes are obstructed, and mobility is remarkably deteriorated. An interface between $SiO_2$ and Si, which has been used for years, can be constituted in such a manner as to have very few interface defects. In this case, a density of interface trap (Dit) can be reduced to the order of $10^9$ $cm^{-2}$ $eV^{-1}$. From this respect, it is considered that the interface defects can be reduced to some degree with an $SiO_2$-based silicate material, and the material has been intensively developed. However, silicate is not sufficient in the sense of dielectric constant for the next generation, and a high-dielectric-constant oxide needs to be developed as the insulating film for the future. However, this represents a large problem. When a high-dielectric-constant oxide is directly formed into a film on an Si substrate, there is a problem that very many interface defects are generated in the interface. For example, when $CeO_2$ is actually epitaxially grown on an Si (111) surface, Dit reaches $5\times10^{13}$ $cm^{-2}$ $eV^{-1}$. Moreover, in consideration of a high-speed operation of an integrated circuit, it is an essential proposition to suppress Dit to that of an $SiO_2$/Si interface or less (order of $10^9$ $cm^{-2}$ $eV^{-1}$ or less).

On the other hand, many methods of epitaxially growing an insulating material on the Si substrate have been proposed (see, e.g., Jpn. Pat. Appln. KOKAI Publication No. 2002-100766). In view of a strong demand for inhibition of generation of the low-dielectric-constant layer and minimization of the interface defect density, in any of the epitaxially grown insulating film which have heretofore been proposed, both the prevention of the low-dielectric-constant layer from being generated and the suppression of the interface defect density to a degree of the density of the $SiO_2$/Si interface cannot be achieved at the same time. On the other hand, a large number of proposals that amorphous oxide be grown on Si have been made, but there has not been any development to solve the problem and achieve both the inhibition of the generation of the low-dielectric-constant layer and the minimization of the interface defect density.

Furthermore, it has also been pointed out that when a high-dielectric-constant oxide is epitaxially grown directly on Si, electron barriers cannot be sufficiently high, and a tunnel current cannot be suppressed (e.g., McKee, Science vol. 293 p468 (2001), etc.).

Moreover, a technique of forming Sr, Ti metal or the like into a thick film while $SiO_2$ remains on the Si substrate has been reported in the following two papers (Ishiwara, Japanese Journal of Applied Physics 30 p1415 (1991), Ishiwara, Japanese Journal of Applied Physics 33 p1472 (1994)). In this case, the low-dielectric-constant layer is generated in the vicinity of the interface, and strictly speaking, it is impossible to achieve an equivalent $SiO_2$ film thickness of 0.5 nm or less, which is necessary for the gate insulating film.

For example, when a Ti metal is formed into a film, Ti silicate is generated in the interface. Moreover, Ti has a further problem. Since the band offset of the conduction band of dielectric ($TiO_2$ or $SrTiO_3$) made in this film formation process is very low, Ti has not originally been suitable for the gate insulating film. This also applies to the following series of documents, which are aimed principally at the epitaxial growth of oxide on Si, and do not present any solution to the interface characteristic or band offset, which are very important for the field-effect transistor.

As development obtained by expanding the above-described two documents, a technique for obtaining Sr silicate has been reported in which an initial $SiO_2$ film is thinned, and an Sr film is formed on the $SiO_2$ film while changing the Sr amount (Journal of Vacuum Science & Technology B18 p2139 (2000) (Motorola)). However, after a heat treatment, the dielectric constant of the interface is lowered as low as that of $SiO_2$. Since resistance to oxidation is very low in this manner, it is impossible to achieve an equivalent $SiO_2$ film thickness of 0.5 nm or less, which is necessary for the gate insulating film.

A technique in which an SrO film is directly formed using hydrogen termination has also been reported (Saiki, Applied Physics Letter 65 p3182 (1994)). Hydrogen comes off the interface during film formation, but it is substantially impossible to terminate the dangling bonds of the Si interface by SrO, which is a material having no polarity. Therefore, a large amount of interface defects are generated. In general, when a hydrogen-terminated surface is used, the termination breaks during the film formation, and an interface portion becomes active. Even when forming gas annealing (FGA) is performed, recovery after the interface completion is limited. Since the recovery is not completed, reactivity of the interface remains as much. Therefore, interface oxidation proceeds depending on the post-processing temperature, and the low-dielectric-constant layer is generated. Even when the high-dielectric-constant material is epitaxially grown, the interface defect density is large (Dit=$5 \times 10^{13}$ cm$^{-2}$ eV$^{-1}$). Even when the FGA is performed, a recovery is expected only in an order of magnitude. It is also seen that when the annealing is performed in oxygen, low-dielectric-constant silicate is generated in the interface as described above.

A research has also been reported in which one monolayer (1 ML) of $SrSi_2$ is formed into a film, and excessive metal Sr is further formed into a film, and thereafter oxygen is introduced (McKee, Science vol. 293 p468 (2001), McKee, 2002 IEDM Technical Digest p955 (2002)). When excessive Sr is introduced onto $SrSi_2$, a silicide film thickness increases even at low temperature, the insulating property is broken, and the termination structure cannot be constituted. Additionally, since time or Sr amount is not sufficiently controlled, the silicide film thickness is distributed at random, and the interface is considerably roughened. On a metal silicide roughened in this manner, SrO is formed into a film. Usually, the silicide is metallic. Even when SrO is formed on silicide, a band gap does not open. This is because SrO does not generate excessive bonds as an oxide. Since the dangling bonds are left in metallic silicide, the resistance to oxidation remarkably deteriorates. Reflecting that the metal silicide having a random thickness is introduced as described above, there are many defects in the interface. Even when the forming gas annealing is performed, the defect density Dit remains in the order of $10^{11}$ cm$^{-2}$ eV$^{-1}$. In the development performed in this document, there is a point where silicide such as $BaSi_2$ and $SrSi_2$ is adopted as a substrate for epitaxially growing mainly $SrTiO_3$ or the like on Si. In this case, it is most important to take over lattice information of the substrate into an oxide or the like grown in an upper part, and a small number of defects may exist in the interface. The defects of the interface in a case where oxides such as SrO, BaO, $SrTiO_3$, $BaTiO_3$ are epitaxially grown on silicide are about $10^{12}$ cm$^{-2}$ eV$^{-1}$ at the film formation time (improvement in an order of magnitude is seen by the annealing after the film formation). This value of $10^{12}$ cm$^{-2}$ eV$^{-1}$ is very small for the substrate for taking over a lattice constant at the time of the epitaxial growth on Si. On the other hand, this is an excessively large value as the defect of the Si/insulating film interface in a case where the gate insulating film is formed on Si to form the field-effect transistor.

Development similar to the above-described McKee's development has been reported as follows (Norton, Journal of Vacuum Science & Technology B20 p257 (2002)). However, initially formed $SiSr_2$ silicide has a differing film thickness, depending on the location, and the interface is in a very active state because of this film thickness profile. Therefore, a silicate structure is generated at the time of Ba film formation in oxygen at a low temperature of 550° C. As compared with the above-described McKee, there is a large film thickness change in the silicide of this document, therefore activity of the interface is higher, and resistance to oxidation is low.

In a case where a high-dielectric-constant film including silicate is directly formed on the Si substrate for a purpose of preparing the field-effect transistor, the interface low-dielectric-constant layer is generated, thus it is difficult to form a gate insulating film having an equivalent $SiO_2$ film thickness largely below 1 nm (thickness of 0.5 nm or less is a target at present, but there is a possibility that the thickness further decreases in the future). As an example, Zr silicate is generated with $ZrO_2$, and $SiO_2$ is generated with $SrTiO_3$ in the interface. There has thus been a demand for enhancing the resistance to oxidation. Even in a case where the film is directly formed on the Si substrate, and the low-dielectric-constant layer cannot be formed, it is meaningless if the interface defect density is large.

Moreover, in the above-described Jpn. Pat. Appln. KOKAI Publication No. 2002-100766, a field-effect transistor has been described in which the Si substrate is terminated by silicide having a thickness of two mono-layers or less, such as La silicide, and further the insulating film is formed thereon. However, the silicide of this document is regarded as a metal, thus reactivity is very strong, and the silicide is not suitable for forming a thin film. This is caused by a trivalent material such as La, in which the bond on the La side is excessive, and Si dangling bonds are not terminated well. Once a silicate is formed, oxidation of substrate Si proceeds at random, and the interface with the upper-part thin film is roughened, because silicate itself has a low dielectric constant, and oxygen cannot be blocked by silicate. This causes a problem in the gate insulating film.

Therefore, there has been a demand for realization of a semiconductor device in which the dangling bonds of Si of the semiconductor substrate are terminated by an insulating metal silicide thin film formed on the semiconductor substrate containing Si as a main component, and a method of manufacturing the semiconductor device.

BRIEF SUMMARY OF THE INVENTION

According to a first aspect of the invention, there is provided a semiconductor device which comprises:

a semiconductor substrate containing Si as a main component; and an active element formed on the semiconductor substrate and including an insulating metal silicide thin film formed on the semiconductor substrate, dangling bonds of Si of the semiconductor substrate being terminated by the insulating metal silicide thin film.

According to a second aspect of the invention, there is provided a method of manufacturing a semiconductor device which comprises:

forming one mono layer of an insulating metal silicide film on a substrate containing Si as a main component;

forming a high-dielectric insulating film on the insulating metal silicide film; and selectively forming a metal film on the high-dielectric insulating film.

DETAILED DESCRIPTION OF THE INVENTION

According to the present invention, there is provided a semiconductor device which includes an insulating metal silicide thin film directly and epitaxially grown on a semiconductor substrate containing silicon (Si) as a main component, to thereby artificially open a band gap, so that resistance to oxidation is enhanced, and further includes a gate insulating film of a high-dielectric-constant oxide formed on the insulating metal silicide thin film.

Moreover, according to the present invention, there is provided a method of manufacturing a semiconductor device, in which an insulating metal silicide thin film is formed into one mono-layer, for example, by any of sputtering, chemical vapor deposition (CVD), atomic layer deposition (ALD), and molecular beam epitaxy (MBE).

Prior to description of embodiments of the present invention, first, an outline of the present invention will be described hereinafter. When an insulating film is formed on a semiconductor substrate through an insulating metal silicide thin film (this thin film is an insulator whose band gap is sufficiently opened), dangling bonds of the insulating film/semiconductor interface is terminated by the insulating metal silicide thin film during a film formation process/subsequent high-temperature process. As a result, activity of the interface deteriorates, and resistance to oxidation is remarkably enhanced. Moreover, since the dangling bonds of the interface can be terminated, interface defects can be removed. This means that there are generated only lower densities of interface defects than that of interface defects in an $Si/SiO_2$ interface, so that this insulating metal silicide thin film is very advantageous as an under layer for forming a gate insulating film.

Here, the following three configurations of the insulating metal silicide thin films are considered. First, a metal M whose valence number is +2 or +4 is formed into one mono-layer (1 ML) in the form of disilicide $MSi_2$. That is, when 1 ML of silicide is formed on a (2×1) structure of an Si (001) surface at high temperature (600 to 900° C. depending on the material), a very stable reconstructed structure can be realized. At this time, it has been found that the dangling bonds of the Si (001) surface receive electrons and are terminated, and the band gap is opened and greatly stabilized with a mere 1 ML of silicide. Here, the film needs to be formed by fine control of the metal amount. When a total metal amount exceeds, the metal can be desorbed again by keeping it at high temperature. This is because the structure to which 1 ML of the metal has been attached is a very stable structure, whereas a structure to which excess metal has been attached brings about a rise in energy. When excess metal exists on the above-described stable 1 ML of silicide, the excess metal may be desorbed at the high temperature. Additionally, since there is a possibility that the metal enters the inside at an excessively high temperature, attention is required. That is, there is an appropriate temperature. As a method of relaxing conditions on a high temperature side, there is a method of doping an Si substrate with As (doped or counter-doped substrate for preparing a channel may be used as such). That is, when the Si substrate is doped with As, any metal can be prevented from entering the substrate. Therefore, the excess metal may be desorbed at higher temperatures. When a self-forming process of 1 ML insulating thin film disilicide at the high temperature is used in this manner, high-precision 1 ML of $MSi_2$ structure can be easily formed (it is seen in an example described later that Dit decreases to $8\times10^8$ cm$^{-2}$ eV$^{-1}$, but this value is not a limitation. Theoretically, a further higher precision is possible). As +2 valent metal M, at least one element selected from Mg, Ca, Sr, Ba, Co, Ni, Pd, Pt, Cu, Ag, and Zn is effective. As +4 valent metal, at least one element selected from Ti, Zr, Hf, Mo, W, Ru, Os, and Ir is effective.

Secondly, 1 ML of metal M whose valence number is +2 is formed into a film in the form of monosilicide MSi. That is, when 1 ML of silicide is formed on a (2×1) structure of an Si (001) surface at high temperature, a very stable reconstructed structure can be realized. It has been discovered that the dangling bonds of the Si (001) surface receive electrons to be terminated, and a band gap is opened and most stabilized by just 1 ML of silicide.

Here, the film needs to be formed with fine control of the metal amount, that is, repeatedly at the rate of small amount with respect to the metal. However, when a total metal amount exceeds, the metal can be desorbed again by keeping it at a medium temperature (400 to 700° C. depending on the material) This is because the structure to which 1 ML of the metal has been attached is a very stable structure, whereas a structure to which excess metal has been attached brings about a rise in energy. When the process at the high temperature is used in this manner, high-precision 1 ML of MSi structure can be easily formed. The metal M is at least one element selected from Mg, Ca, Sr, Ba, Co, Ni, Pd, Pt, Cu, Ag, and Zn.

Thirdly, 1 ML of metal M whose valence number is +4 is formed into a film in the form of monosilicide MSi. That is, when 1 ML of silicide is formed on a (1×1) structure of an Si (001) surface at high temperature, a very stable reconstructed structure can be realized. At this time, it has been found that the dangling bonds of the Si (001) surface receives electrons to be terminated, and a band gap is opened and greatly stabilized with a mere 1 ML of silicide. Here, the film needs to be formed with fine control of the metal amount. However, when a total metal amount exceeds, the metal can be desorbed again by keeping it at a medium temperature (400 to 700° C. depending on the material). This is because the structure to which 1 ML of the metal has been attached is a very stable structure, whereas a structure to which excess metal has been attached brings about a rise in energy. When the process at the high temperature is used in this manner, a high-precision 1 ML of an MSi structure can be easily formed. As the metal M, at least one of Ti, Zr, Hf, Mo, W, Ru, Os, and Ir is effective.

Moreover, when a metal such as Sr is excessively and randomly present in a dielectric film on the insulating metal silicide, a metallic surface state (state in which electrons are partially congested) is generated inside the band gap, deterioration of Dit, increase of interface reactivity and the like occur. However, when a more stable and extreme thin film of high-resistance silicide is formed on the silicide described above in such a manner as to have a regular reconstructed structure, band offset of an Si substrate and insulating film on a conduction band side can be increased using the pinning effect due to a gap internal state. Additionally, since the structure can be regularly disposed, mobility is substantially unaffected.

For example, the small band offset on the conduction band side is regarded as a serious problem in titanium oxide known by its high dielectric constant. However, when the above-described pinning effect is used, the band offset on the conduction band side can be set to 1.0 eV, and a band offset on a valence electron band side can be set to 1.1 eV. Here, a high-resistance silicide means a state in which an extreme thin film of the silicide is formed on the insulating metal silicide described above, and localized states are added into the band gap.

When the above-described insulating metal silicide interface structure is used, an initial film of a dielectric film does not have to be limited to an alkaline earth oxide. The above-described McKee (Vol. 293 p468 (2001)) is limited to an alkaline earth oxide (e.g. SrO, Bao). This is because the termination of the Si substrate surface is not completed, and therefore the interface structure is unstable. For example, after forming a mono-layer of $SrSi_2$ into a film at 700° C., amorphous $HfO_2$ is formed into a film at 150° C., and thereafter annealed at 500° C., and accordingly the films can be formed. An interface of $SrSi_2/SrO$ is not required, so that it is sufficient if a mono-layer silicide alone (e.g. $SrSi_2$ alone) is provided, which is an effective aspect of the invention.

Here, a relation between the insulating film and the insulating metal silicide thin film of the substrate will be briefly described. The insulating metal silicide thin film whose constituting element is metal M according to the present invention will be considered. A special silicide thin film according to the present invention is very stable against oxidation/nitriding as compared with usual bulk silicide. Therefore, even in a case where the metal M is usually oxidized (nitrided), oxidation (nitriding) does not advance. For example, a case where usual silicide $HfSi_2$ is formed on Si will be described. When a $TiO_2$ film is further formed, oxidation of a silicide portion advances, and finally a low-dielectric-constant layer is finally generated.

On the other hand, when $HfSi_2$ is formed as an insulating metal silicide, resistance to oxidation is greatly enhanced. Therefore, even when a $TiO_2$ film is formed in an upper part, no low-dielectric-constant layer is generated in a substrate portion. Thus, with respect to a substrate terminated by the insulating metal silicide thin film according to the embodiments, various materials are usable, such as an oxide ($SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, $LaAlO_3$, $SrHfO_3$, $SrZrO_3$, $SrTiO_3$, HfSiO, HfAlO, AlSiO, etc.), a nitride ($Si_3N_4$, AlN, $Hf_3N_4$, $Zr_3N_4$, $Ti_3N_4$, etc.), and an oxynitride (SiON, AlON, YON, LaON, GdON, CeON, TaON, HfON, ZrON, TiON, LaAlON, SrHfON, SrZrON, SrTiON, HfSiON, HfAlON, AlSiON, etc.). Many insulating films can be adopted in this manner, because an interface silicide remarkably satisfactorily terminates the substrate surface.

Embodiments of the present invention will be described hereinafter with reference to the drawings.

(First Embodiment)

As a first embodiment of the present invention, an MIS-FET will be described in which an amorphous $HfO_2$ dielectric film is disposed on an Si substrate.

Figure 1:
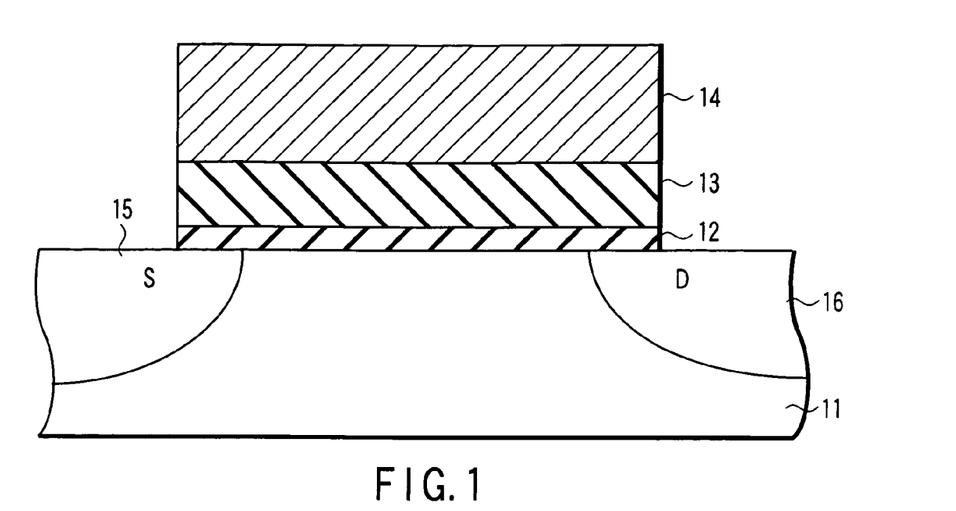
FIG. 1 is a sectional view schematically showing a gate insulating film portion of an MISFET for use in an embodiment of the present invention.

FIG. 1 is a sectional view showing a gate insulating film portion of the MISFET according to the embodiments of the present invention. That is, in the MISFET of the present embodiments, a source region (S) 15, and a drain region (D) 16 are formed in a surface portion of a silicon substrate 11, and on a channel region formed between the source and drain regions, a gate electrode 14 is disposed via an insulating metal silicide thin film 12 and a gate insulating film 13. Here, the silicide thin film 12 is constituted of an insulating metal silicide ($TiSi_2$), and terminates dangling bonds of the Si substrate.

The manufacturing steps will be described with reference to FIGS. 2 and 3. First, a cleaned surface of the Si substrate 11 whose main surface is a (001) surface is prepared. In this process, general HF (hydrofluoric acid) treatment is performed, a highly thin film of $SiO_2$ is formed by ozone oxidation at room temperature, and the surface is protected. This substrate is conveyed to an MBE apparatus, impurities on a topmost surface are desorbed and removed in an ultra-high vacuum at 250° C., and subsequently the highly thin oxide film $SiO_2$ on the surface is flied and removed at a high temperature of 880° C. At this time, it is confirmed by reflection high energy electron diffraction (RHEED) that the cleaned surface appears, and a 2×1 structure is formed.

Figure 2:
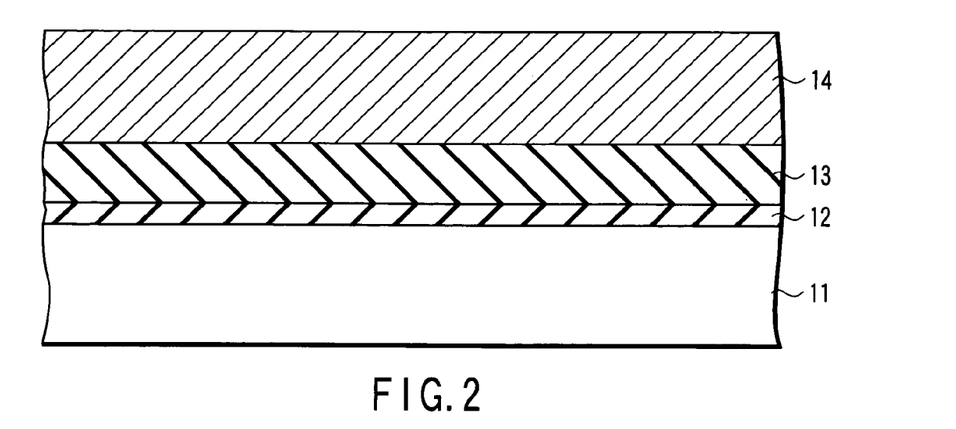
FIGS. 2 and 3 are sectional views showing a method of forming the MISFET in a stepwise manner.
Figure 3:
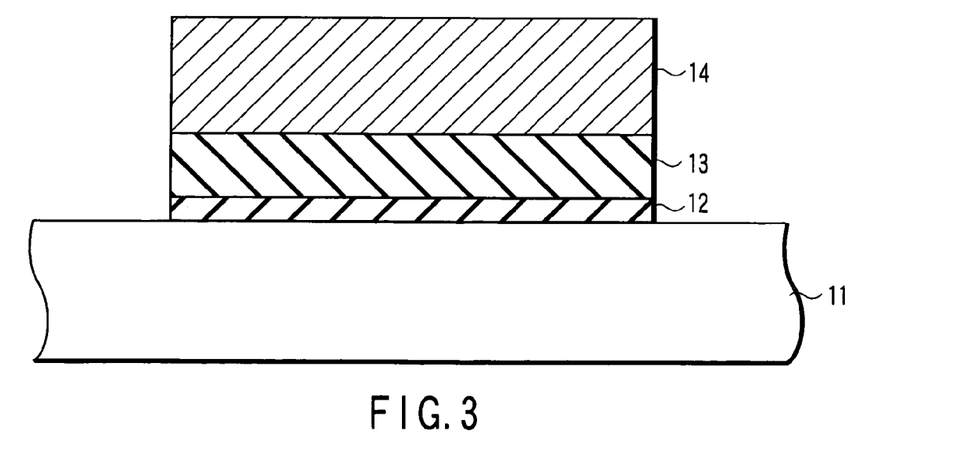

Next, as shown in FIG. 2, an $TiSi_2$ thin film is formed as the insulating metal silicide thin film 12. While a shutter is opened/closed, Ti is repeatedly evaporated at the rate of a small amount from a Knudsen cell (K-cell), and the amount is controlled by watching the RHEED signal. The substrate temperature is set at a high temperature of 700° C., and the opening/closing of the shutter is precisely controlled. A necessary amount of Ti can be calculated as an amount such that $TiSi_2$ is formed into 1 ML. Therefore, (1) Ti is evaporated by 10%, followed by standby time of ten seconds until the RHEED signal intensity stabilizes, which is repeated nine times, subsequently (2) a film is formed by 2%, followed by standby time of five seconds, which is repeated four times, and finally (3) a film is formed with a high precision of 0.5%, followed by standby time of five seconds, which is repeated four times. It is seen that in the last step (3) of the process, a change of the RHEED signal intensity becomes excessively small, and a maximum intensity is obtained. It can be confirmed that the RHEED signal intensity tends to drop if Ti formation is further continued. It has been confirmed that even when the RHEED signal intensity drops, further heating at a high temperature of 800° C. and at a standby time of about ten seconds eliminate excess Ti to recover the 1 ML of $TiSi_2$. Thus, the 1 ML of $TiSi_2$ can be formed. Here, the high-temperature process is stepwise performed at 700° C. and 800° C. A reason why the temperature is lowered by about 100° C. in an initial stage is that at an excessively high temperature in the initial stage, movement of Ti on the surface increases, the fixing ratio of Ti deteriorates, and further entrance of Ti into the substrate raises a problem. Therefore, a process in which 1 ML is formed at 700° C. and then the temperature is raised to 800° C., assuming a case wherein excess Ti is further present, is considered to be optimal.

As a result of scanning tunneling spectroscopy (STS) observation of 1 ML of $TiSi_2$ at room temperature, it has been confirmed that the insulating property on the surface is realized, and a band gap is opened in the silicide (hereinafter referred to as insulating metal silicide). This surface is remarkably stable against oxygen at a film forming temperature (700° C.) or less, and it is possible to form oxide into the film in oxygen avoiding interface oxidation. On the other hand, even at the film forming temperature (700° C.) or less, the insulating property is easily damaged by excess metal. That is, when excess Ti is present, silicide formation advances, and the interface changes to the metal. If the interface turns to the metal, there is reactivity to oxygen, and interface oxidation advances.

For example, when 0.2 ML of Ti is formed, and further amorphous $HfO_2$ film is formed thereon, Ti silicide and $SiO_2$ thin film appears in the interface, thereby a thick low-dielectric-constant layer is formed.

Next, the Si substrate on which 1 ML of the $TiSi_2$ insulating film has been formed is conveyed into a sputtering apparatus. First, in an ultra-high vacuum, impurities on the surface are desorbed and removed at 250° C. Thereafter, as shown in FIG. 2, sputtering film formation is performed at a low temperature of 250° C. to form an amorphous $HfO_2$ layer, which is the high-dielectric insulating film 13, in a compound mode (state in which particles fly in the form of $HfO_2$ or HfO). The $HfO_2$ layer is formed into a film thickness of 4 nm. Here, the oxygen partial pressure can be set to be high from the initial stage of the sputtering film formation. Therefore, (also because of an effect of the film formation in the compound mode) Hf in a metal state can be completely prevented from being attached to the interface.

The point of the above-description lies in that the oxygen partial pressure can be set to be high from the film formation initial stage, and the compound mode of the sputtering is used. However, when only one of the above two conditions is adopted, a satisfactory characteristic is attainable, though it is not so good as the above-described formation. That is, since the oxygen partial pressure is set to be high from the initial stage in the film formation, various film forming methods can be adopted. For example, oxygen can be introduced in an MBE process from the initial stage of the film formation. Moreover, in a CVD process, in which a compound is deposited, a very satisfactory dielectric film is supposed to formed. This process, which is shown in the following embodiment, is made possible greatly owing to the fact that the substrate surface can be structured to be strong against oxygen, and it is shown that the insulating metal silicide thin film has a very large advantage.

Next, a TiN layer (14) for a gate electrode is formed by sputtering. Thereafter, as shown in FIG. 3, the gate electrode 14 is formed by a well known method, and impurities are injected into the substrate using the gate electrode as a mask to form the source region 15 and drain region 16.

Characteristics of the n-type MISFET obtained in this manner were checked. The equivalent $SiO_2$ film thickness of the gate insulating film was as small as 6.7 angstroms. When a large electric field of 5 MV/cm was applied, and a leakage current at this time was measured, a very small value of 0.1 $A/cm^2$ was obtained.

As a comparative example, the leakage current of an $SiO_2$ insulating film alone at 5 MV/cm was obtained by extrapolation, with the result that the value was $10^5$ $A/cm^2$, which was $10^6$ times the above-described embodiment. Therefore, it was found that an insulating film having a satisfactory leakage characteristic can be formed. A satisfactory structure can be formed in which no defects are generated in an Si substrate/dielectric interface or a dielectric/electrode interface. At this time, measurement of an interface defect density Dit between the Si substrate and the dielectric indicates about $9 \times 10^8$ $cm^{-2}$ $eV^{-1}$, which is superior to a value in a case where the $SiO_2$ thin film interface on the Si substrate is optimized, and is a satisfactory value. This is obtained as a result of optimization of processes to form a silicide structure and a high-dielectric thin film on the structure. As a result, a mobility (550 $cm^2V^{-1}$ $sec^{-1}$) of the electron equal to or higher than that in the $Si/SiO_2$ interface is obtained, and it was confirmed that the interface forming process is very effective.

Moreover, it was found that a similar structure was possible not only in the silicon substrate but also a strained silicon substrate, and enhancement of the mobility by the strained substrate was realized. In 1 ML insulating silicide, a change of about 1% in a substrate lattice constant can be absorbed, and a similar structure can be formed in the strained silicon substrate. Needless to say, when a dielectric is epitaxially grown on strained silicon substrate, the lattice constant of a dielectric portion needs to agree with that of the substrate within about ±1.5%. When the amorphous dielectric thin film is used, no restrictions are imposed on the lattice constant of the dielectric.

Then, the same structure as the above-described embodiment was formed on a 1% strained silicon substrate. The measurement of the interface defect density Dit between the strained silicon substrate and the dielectric indicated a value of about $1 \times 10^9$ $cm^{-2}$ $eV^{-1}$, and this value substantially agreed with that in amorphous $HfO_2$ on the Si substrate. As a result of the measurement of the mobility, a high value of 650 $cm^2V^{-1}sec^{-1}$ was obtained, thus effectiveness of the insulating silicide thin film on the strained silicon substrate has been confirmed.

Moreover, as another comparative example, the Si substrate was cleaned and terminated by hydrogen, and an $HfO_2$ thin film was formed on the substrate under the same conditions as the above-described embodiment (the film formation by sputtering of $HfO_2$). It was confirmed that a low-dielectric-constant layer of an Hf silicate is generated in the interface, and an equivalent $SiO_2$ film thickness is lowered. Similarly, it has been reported with regard to many materials that the low-dielectric-constant layer is generated in the interface through a film forming step or a high-temperature process. On the other hand, it was found with regard to the insulating metal silicide layer of the present embodiment that the resistance to oxidation is remarkably enhanced, and various dielectric films can be formed on the layer.

It is to be noted that in the first embodiment, MBE was used in forming the insulating metal silicide thin film, but sputtering, CVD, ALD or the like is usable. This also applies to the following embodiments.

(Second Embodiment)

Next, as a second embodiment of the present invention, an MISFET will be described in which an amorphous $SrHfO_3$ dielectric film is disposed on an Si substrate. The configuration is the same as that of the first embodiment, and will therefore be described with reference to FIGS. 1 to 3.

In the FET of the present embodiment, an insulating metal silicide thin film 12 is one mono layer (1 ML) of an $SrSi_2$ thin film, and terminates dangling bonds of an Si substrate 11.

Manufacturing steps will be described. First, in the same manner as in the first embodiment, a cleaned surface of the Si substrate 11 whose main surface is a (001) surface is prepared. Next, as shown in FIG. 2, as the insulating metal silicide thin film 12, an $SrSi_2$ thin film was formed. While a shutter is opened/closed, Sr is repeatedly evaporated from a Knudsen cell (K-cell) by a small amount every shatter open, and the amount is controlled by watching an RHEED signal. To form 1 ML of an insulating metal silicide thin film $SrSi_2$, three stages of film formation are performed in the same manner as in the first embodiment. The present embodiment differs from the first embodiment in that the substrate temperature is set at 600° C. When a maximum point of an RHEED signal intensity is exceeded, and further Sr film formation is continued, the RHEED signal intensity drops, but it is confirmed that by keeping it in a standby state of about ten seconds at a higher temperature of 700° C., excess Sr takes off and returns to 1 ML of $SrSi_2$. Here, a reason why the high-temperature process is performed in two steps at 600° C. and 700° C. is the same as that of the first embodiment, but each temperature in the case of Sr is lower by 100° C. than the first embodiment. An optimum temperature is determined for each silicide, but the same process as that of Sr can be executed in most materials (Mg, Ca, Ba, Co, Ni, Pd, Pt, Cu, Ag, Zn, Mo, W, Ru, Os, and Ir). It is known that the same process as that of Ti is preferable for some of the materials. These materials are Ce, Hf, and Zr.

Scanning tunneling spectroscopy (STS) observation of this 1 ML of $SrSi_2$ at room temperature revealed that the silicide is an insulating metal silicide whose surface has an insulating property and whose band gap was opened.

This surface is remarkably stable against oxygen at the film forming temperature (600° C.) or less, and thus it is possible to form an oxide film in oxygen while avoiding interface oxidation. On the other hand, even at the film forming temperature (600° C.) or less, the insulating property is easily damaged by excess metal. That is, when excess Sr is present, silicide formation advances, and the interface changes to the metal. Therefore, when the interface turns to the metal, reactivity to oxygen appears, and interface oxidation advances. For example, when 0.2 ML of Sr was formed and an amorphous $HfO_2$ film was formed thereon, an Sr silicate and $SiO_2$ thin film appeared in the interface, so that a thick low-dielectric-constant layer is formed.

Next, the Si substrate on which 1 ML of the $SrSi_2$ insulating film has been formed is conveyed into a CVD apparatus. First in an ultra-high vacuum, impurities on the surface are desorbed and removed at 250° C. Thereafter, as shown in FIG. 2, an amorphous $SrHfO_3$ layer, which is the high-dielectric insulating film 13, is formed at a low temperature of 250° C. The $SrHfO_2$ layer is formed to a film thickness of 4 nm. Here, the oxygen partial pressure can be set to be high from the initial stage of the film formation. Therefore, Hf or Sr in a metal state can be completely prevented from being attached to the interface. Thereafter, annealing is performed in oxygen at 550° C., five minutes.

At this time, when an interface defect density Dit between the Si substrate and dielectric was measured, a satisfactory value of about $8 \times 10^8$ $cm^{-2}$ $eV^{-1}$ was obtained. This is obtained as a result of optimization of processes to form a silicide structure and a high-dielectric thin film on the structure. As a result, a high mobility ($560$ $cm^2V^{-1}sec^{-1}$) was obtained, and it has been confirmed that this interface forming process is very effective.

The same structure as described above was formed on a 1% strained silicon substrate. The measurement of the interface defect density Dit between the strained silicon substrate and dielectric indicated a value of about $9 \times 10^8$ $cm^{-2}$ $eV^{-1}$, and this value substantially agreed with that in amorphous $SrHfO_3$ on the Si substrate. As a result of the measurement of the mobility, a high value of $670$ $cm^2V^{-1}sec^{-1}$ was obtained, and effectiveness of the insulating silicide thin film on the strained silicon substrate was confirmed.

(Third Embodiment)

Next, as a third embodiment of the present invention, an MISFET will be described in which an amorphous $ZrO_2$ dielectric film is disposed on an Si substrate. The configuration is the same as that of the first embodiment, and will therefore be described with reference to FIGS. 1 to 3.

In the third embodiment, an insulating metal silicide thin film 12 is one mono layer (1 ML) of an NiSi mono silicide thin film, and terminates a dangling bond of the Si substrate.

Manufacturing steps will be described. First, a cleaned surface of an Si substrate 11 whose main surface is a (001) surface is prepared. This process has been described in the first embodiment. Next, as shown in FIG. 2, the insulating metal thin film 12 (NiSi mono silicide) is formed in the same manner as in the first embodiment. While a shutter is opened/closed, Ni is repeatedly evaporated from a Knudsen cell (K-cell) by a small amount every shutter open, and the amount is controlled while watching an RHEED signal. Three stages of film formation are performed in such a manner as to obtain 1 ML of NiSi in the same manner as in the first embodiment. The present embodiment differs from the first embodiment in that a substrate temperature is set at 450° C.

When a maximum point of an RHEED signal intensity is exceeded, and further an Ni film formation is continued, the RHEED signal intensity drops. However, it is confirmed that by keeping at a standby state of about ten seconds at a higher temperature of 550° C., excess Ni takes off and returns to 1 ML of NiSi. Also in the third embodiment, the high-temperature process is performed in two steps at 450° C. and 550° C. for the same reason as the first embodiment. A reason why the temperature for NiSi is considerably low is that the formation temperature of mono silicide is low, and the same process can be executed with respect to all effective materials (Mg, Ca, Sr, Ba, Co, Ni, Pd, Pt, Cu, Ag, and Zn).

STS observation of this 1 ML of NiSi at room temperature revealed that the silicide was an insulating metal silicide whose surface has an insulating property and whose band gap was opened. This surface is remarkably stable against oxygen at the film forming temperature (450° C.) or less, and it is possible to form an oxide film in oxygen while avoiding interface oxidation.

On the other hand, even at the film forming temperature (450° C.) or less, the insulating property is easily damaged by excess metal. That is, when excess Ni is present, silicide formation advances, and the interface changes to the metal. When the interface turns to the metal, reactivity to oxygen appears, and interface oxidation advances. For example, when 0.2 ML of Ni is formed, and further an amorphous $HfO_2$ film is formed thereon, an $SiO_2$ thin film appears in the interface, thus a thick low-dielectric-constant layer is formed.

Next, the Si substrate on which 1 ML of the NiSi insulating film has been formed is conveyed into a CVD apparatus. First, in an ultra-high vacuum, impurities on the surface are flied and removed at 250° C. Thereafter, as shown in FIG. 2, an amorphous $ZrO_2$ layer, which is the high-dielectric insulating film 13, is formed at a low temperature of 250° C. The $ZrO_2$ layer is formed to a film thickness of 4 nm. Here, the oxygen partial pressure can be set to be high from the initial stage of the film formation. Therefore, Zr in a metal state can be completely prevented from being attached to the interface. Thereafter, annealing is performed in oxygen at 550° C., five minutes. At this time, there is uncertainty in stability of the silicide film, but no change appeared in the interface by the annealing in oxygen at 550° C. for five minutes.

Furthermore, even when the annealing was performed at 1050° C. for several seconds, a very stable interface structure itself was reflected, and no interface low-dielectric-constant layer appeared. When an interface defect density Dit between the Si substrate and dielectric was measured at this time, a satisfactory value of about $2 \times 10^9$ $cm^{-2}$ $eV^{-1}$ was obtained. This was obtained as a result of optimization of processes to form a silicide structure and a high-dielectric thin film on the structure. As a result, a high mobility ($500$ $cm^2V^{-1}sec^{-1}$) was obtained, and it has been confirmed that this interface forming process is very effective.

The same structure as described above was formed on a 1% strained silicon substrate. The measurement of the interface defect density Dit between the strained silicon substrate and dielectric indicated a value of about $4 \times 10^9$ $cm^{-2}$ $eV^{-1}$, and this value substantially agreed with that in amorphous $ZrO_2$ on the Si substrate. As a result of the measurement of the mobility, a high value of $600$ $cm^2V^{-}$ 1 sec$^{-1}$ was obtained, and effectiveness of the insulating silicide thin film on the strained silicon substrate was confirmed.

(Fourth Embodiment)

Next, as a fourth embodiment of the present invention, a MISFET will be described in which an epitaxial Ca(Zr, Ti)O$_3$ dielectric film is disposed on an Si substrate. The configuration is the same as that of the first embodiment, and will therefore be described with reference to FIGS. 1 to 3.

In the fourth embodiment, an insulating metal silicide thin film 12 is 1 ML of a CaSi$_2$ thin film, and terminates dangling bonds of the Si substrate.

Manufacturing steps will be described. First, a cleaned surface of an Si substrate 11 whose main surface is a (001) surface is prepared. This process has been described in the first embodiment. Next, as shown in FIG. 2, as the insulating metal silicide thin film 12, a CaSi$_2$ thin film was formed. In the same manner as in the first embodiment, while a shutter is opened/closed, Ca is repeatedly evaporated from a Knudsen cell (K-cell) by a small amount every shatter open, and the amount is controlled while watching a RHEED signal. Three stages of film formation are performed in such a manner as to obtain 1 ML of the CaSi$_2$ thin film in the same manner as in the first embodiment. However, in the fourth embodiment, a substrate temperature is set at 600° C. When a maximum point of an RHEED signal intensity is exceeded, and further Ca film formation is continued, the RHEED signal intensity drops. However, it is confirmed that by keeping at a standby state of about ten seconds at a higher temperature of 700° C., excess Ca takes off and returns to 1 ML of CaSi$_2$. In the fourth embodiment, the reason why the high-temperature process is performed in two steps at 600° C. and 700° C. is the same as that of the first embodiment, but each temperature in the case of Ca is lower by 100° C.

STS observation of this 1 ML of CaSi$_2$ at room temperature revealed that the silicide was an insulating metal silicide whose surface has an insulating property and whose band gap was opened.

This surface is remarkably stable against oxygen at the film forming temperature (600° C.) or less, and it is possible to form an oxide film in oxygen while avoiding interface oxidation. On the other hand, even at the film forming temperature (600° C.) or less, the insulating property is easily damaged by excess metal. That is, when excess Ca is present, silicide formation advances, and the interface changes to the metal. Therefore, when the interface turns to the metal, reactivity to oxygen appears, and interface oxidation advances. For example, when 0.2 ML of Ca is formed, and further an amorphous HfO$_2$ film is formed thereon, Ca silicate and SiO$_2$ thin film appears in the interface, thus a thick low-dielectric-constant layer is formed.

Next, the Si substrate on which 1 ML of the CaSi$_2$ insulating film has been formed is retained as such in an MBE apparatus. As shown in FIG. 2, a high-dielectric insulating film 13 is formed. A CaO film is first formed into 1 ML. Under ozone flux at a flow rate of 1.5×10$^{12}$ molecules/second cm$^2$, Ca is grown at a pressure of 10$^{-7}$ Pascals and at a low substrate temperature of 200° C. Next, a (Zr, Ti)O$_2$ film is formed into 1 ML. A (Zr, Ti) solid-soluble metal is grown under the same conditions as those of CaO at a pressure of 10–7 Pascals and at a substrate temperature of 200° C. under ozone flux at a flow rate of 1.5×10$^{12}$ molecules/second cm$^2$. Thereafter, this is repeated to thereby form a Ca(Zr, Ti)O$_3$ epitaxially grown film. The Ca(Zr, Ti)O$_3$ film is formed to a film thickness of 4 nm. Here, ozone flux can be passed from the initial stage of film formation.

Accordingly, Zr, Ti or the like in a metal state can be completely prevented from being attached to the interface. Thereafter, annealing is performed in oxygen at 550° C. for five minutes. A lattice constant of Ca(Ti, Zr)O$_3$ substantially agrees with that of Si, and this is more suitable for epitaxial growth on Si rather than SrTiO$_3$. Moreover, since a band offset of this material with respect to Si on a conduction band side is 1 eV or more, the material is effective as a gate insulating film.

Since a low-dielectric-constant film is formed in the interface between Si and the insulating film, Ca(Ti, Zr)O$_3$ has not heretofore been used as the gate insulating film. However, according to the embodiment of the present invention, Ca(Ti, Zr)O$_3$ can be remarkably effectively formed into the insulating film.

(Fifth Embodiment)

Next, as a fifth embodiment of the present invention, a MISFET will be described in which an amorphous SrTiO$_3$ dielectric film is disposed on an Si substrate. The configuration is the same as that of the first embodiment, and will therefore be described with reference to FIGS. 1 to 3.

In the fifth embodiment, an insulating metal silicide thin film 12 is a high-resistance silicide thin film in which a silicide structure is reconstructed in such a manner as to form a reconstructed structure of four times in size on 1 ML of SrSi$_2$ thin film, and terminates dangling bonds of the Si substrate.

Manufacturing steps will be described. First, a cleaned surface of an Si substrate 11 whose main surface is a (001) surface is prepared in the same manner as in the first embodiment. Next, as shown in FIG. 2, an SrSi$_2$ thin film is formed as the insulating metal thin film 12, and this process is the same as that of the second embodiment. Thereafter, at a high substrate temperature of 600° C., Sr corresponding to 0.0625 ML is repeatedly evaporated from a Knudsen cell (K-cell) by a small amount. At this time, when an RHEED signal is observed, the signal once disappears. However, after elapse of sufficient time, a reconstructed structure having a size four times that of the reconstructed structure exhibited in the initial insulating metal silicide thin film appears.

STS observation of this silicide structure at room temperature revealed that the surface exhibits an insulating property, but localized states appear in a band gap, resulting in a high-resistance semiconductor state. This surface is remarkably stable against oxygen at the film forming temperature (600° C.) or less, and it is possible to form an oxide film in oxygen while avoiding interface oxidation. High-resistance silicide also has a resistance to oxidation substantially equal to that of the insulating metal silicide of the above embodiments. However, even at the film forming temperature (600° C.) or less, the high resistance is easily damaged by excess metal. That is, when excess Sr is present, silicide formation advances, and the interface changes to the metal. When the interface turns to the metal, reactivity to oxygen appears, and interface oxidation advances. For example, when 0.2 ML of Sr is formed, and further an amorphous HfO$_2$ film is formed thereon, an Sr silicate and SiO$_2$ thin film appears in the interface, thus a thick low-dielectric-constant layer is formed.

Next, the Si substrate on which the above-described high-resistance silicide SrSi$_2$ film has been formed is conveyed into a CVD apparatus. First, in an ultra-high vacuum, impurities on the surface are flied and removed at 250° C. Thereafter, an amorphous SrTiO$_3$ film is formed at a low temperature of 250° C., and formed to a film thickness of 20 nm. Here, the oxygen partial pressure can be set to be high from the initial stage of the film formation. Therefore, Ti or Sr in a metal state can be completely prevented from being attached to the interface. Therefore, annealing is performed in oxygen at 550° C. for five minutes.

When an interface defect density Dit between the Si substrate and dielectric was measured at this time, a satisfactory value of about $1\times10^9$ cm$^{-2}$ eV$^{-1}$ was obtained. This is obtained as a result of optimization of processes to form a silicide structure and a high-dielectric thin film on the structure. As a result, a high mobility (540 cm$^2$V$^{-1}$sec$^{-1}$) is obtained, and it has been confirmed that this interface forming process is very effective. In the high-resistance silicide structure, localized states appear in the interface, but a structure keeping precise periodicity is formed as described above. Therefore, it has been found that scattering resulting from a random property is eliminated. Next, a TiN layer for a gate electrode is formed by sputtering, and as shown in FIG. 3, a gate electrode 14, source region 15, and drain region 16 are formed by a well known method.

Characteristics of the n-type MISFET obtained in this manner were checked. The insulating film was a gate insulating film whose equivalent SiO$_2$ film thickness (EOT) was as small as 2.6 angstroms. When a large electric field of 5 MV/cm was applied, and a leakage current at this time was measured, a very small value of 0.1 A/cm$^2$ was obtained. Since an electron barrier is usually low in SrTiO$_3$, leakage current does not stop, and the current cannot be measured in this film thickness. However, the current can be measured, because the band offset of the gate insulating film rises to 1.0 eV. The localized states in the band gap of high-resistance silicide caused pinning, and the band offset was successfully raised.

As a comparative example, when the leakage current of the insulating film only of the SiO$_2$ film at 5 MV/cm was obtained by extrapolation in the same EOT, the value was $10^8$ A/cm$^2$, which is $10^8$ times the above embodiment. Therefore, it has been found that an insulating film having a satisfactory leakage characteristic was obtained. A satisfactory structure can be formed in which no defects are generated in an Si substrate/dielectric interface or a dielectric/electrode interface.

(Sixth Embodiment)

Next, as a sixth embodiment of the present invention, a MISFET will be described in which an amorphous LaAlO$_3$ dielectric film is disposed on an Si substrate. The configuration is the same as that of the first embodiment, and will therefore be described with reference to FIGS. 1 to 3.

In the sixth embodiment, an insulating metal silicide thin film 12 is a TiSi mono silicide thin film of 1 ML, and terminates dangling bonds of the Si substrate.

Manufacturing steps will be described. First, a cleaned surface of an Si substrate 11 whose main surface is a (001) surface is prepared in the same manner as in the first embodiment. Furthermore, the Si substrate 11 is annealed at a high temperature (1050° C.), thus a structure of the cleaned surface is formed into a (1×1) structure.

Next, as shown in FIG. 2, a TiSi mono silicide thin film is formed as the insulating metal thin film 12. While a shutter is opened/closed, Ti is repeatedly evaporated from a Knudsen cell (K-cell) by a small amount every shatter open, and the amount is controlled while watching an RHEED signal. Three stages of film formation are performed in such a manner as to form 1 ML of TiSi film in the same manner as in the first embodiment, but a substrate temperature is set at 550° C.

When a maximum intensity of the RHEED signal intensity is exceeded, and further Ti film formation is continued, the RHEED signal intensity drops. However, even if the RHEED signal drops, by keeping at a standby state of about ten seconds at a higher temperature of 650° C., excess Ti takes off and the film returns to 1 ML of TiSi. A reason why the high-temperature process is performed in two steps at 550° C. and 650° C. is the same as that in the first embodiment, but the temperature in the case of TiSi is considerably low. This is because formation temperature of mono silicide is low, and the film can be formed in the same process with respect to all effective materials (Ti, Zr, Hf, Ce, Mo, W, Ru, Os, and Ir).

STS observation of this 1 ML of TiSi at room temperature revealed that the silicide was an insulating metal silicide whose surface has an insulating property and whose band gap was opened. This surface is remarkably stable against oxygen at the film forming temperature (550° C.) or less, and it is possible to form an oxide film in oxygen while avoiding interface oxidation. On the other hand, even at the film forming temperature (550° C.) or less, the insulating property is easily damaged by excess metal. That is, when excess Ti is present, silicide formation advances, and the interface changes to the metal. Therefore, when the interface turns to the metal, reactivity to oxygen appears, and interface oxidation advances. For example, when 0.2 ML of Ti is formed, and further an amorphous HfO$_2$ film is formed on this layer, an SiO$_2$ thin film appears in the interface, thus a thick low-dielectric-constant layer is formed.

Next, the Si substrate on which 1 ML of TiSi insulating film has been formed is conveyed into a CVD apparatus. First, in an ultra-high vacuum, impurities on the surface are flied and removed at 250° C. Thereafter, as shown in FIG. 2, an amorphous LaAlO$_3$ thin film is formed as a high-dielectric insulating film 13 at a low temperature of 250° C. The LaAlO$_3$ thin film is formed to a film thickness of 4 nm. Here, oxygen partial pressure can be set to be high from the initial stage of the film formation. Accordingly, La or Al in a metal state can be completely prevented from being attached to the interface. Therefore, annealing is performed in oxygen at 550° C. for five minutes. At this time, there is uncertainty in stability of the silicide film, but no changes appeared in the interface by the annealing in oxygen at 550° C. for five minutes.

Furthermore, even when the annealing is performed at 1050° C. for several seconds, reflecting a very stable interface structure itself, no interface low-dielectric-constant layer appeared.

When an interface defect density Dit between the Si substrate and dielectric was measured, a satisfactory value of about $1\times10^9$ cm$^{-2}$ eV$^{-1}$ was obtained. This is obtained as a result of optimization of processes to form a silicide structure and a high-dielectric thin film on the structure. As a result, a high mobility (520 cm$^2$V$^{-1}$sec$^{-1}$) is obtained, and it is confirmed that this interface preparing process is very effective.

The same structure as described above was formed on a 1% strained silicon substrate. The measurement of the interface defect density Dit between the strained silicon substrate and dielectric indicated a value of about $2\times10^9$ cm$^{-2}$ eV$^{-1}$, and this value substantially agreed with that in amorphous LaAlO$_3$ on the Si substrate. As a result of the measurement of the mobility, a high value of 630 cm$^2$V$^{-1}$sec$^{-1}$ was obtained, and effectiveness of the insulating silicide thin film on the strained silicon substrate has been confirmed.

As an example of the semiconductor device of the present invention, the MISFET has been described in the embodiments. However, application of the present invention to a logic circuit such as a CMIS, or memories (especially a peripheral circuit) such as an SRAM, DRAM, flash memory, MRAM, and FeRAM, or to a system LSI on which they are combined and mounted can be considered.

As described above in the embodiments of the present invention, since the dangling bonds of Si of the semiconductor substrate is remarkably satisfactorily terminated by the insulating metal silicide thin film formed on the semiconductor substrate containing Si as a main component, the following advantages are obtained.

(1) Termination of the dangling bonds is maintained even through the high-temperature process.

(2) The substrate/dielectric interface is remarkably superior in resistance to oxidation, and the interface is poor in reactivity.

(3) Defects in the substrate/dielectric interface are hardly recognized, and a satisfactory interface is formed. Therefore, when a dielectric thin film and electrode are further formed on this substrate to constitute a semiconductor device such as a field-effect transistor, owing to the above-described obtained advantages, the mobility of the device can be remarkably enhanced as compared with an $Si/SiO_2$ interface.

Since the surface termination is completed in this insulating metal silicide film forming process, the surface is very stable, and the resistance to oxidation is also enhanced. Additionally, various high-dielectric-constant materials which have not heretofore sufficiently exerted their inherent characteristics can be formed into films. For example, it is possible to form a high-dielectric film (e.g., amorphous $HfO_2$, amorphous $ZrO_2$, amorphous $SrHfO_3$, epitaxial $Ca(Zr, Ti)O_3$, etc.), in which low-dielectric-constant layer $SiO_2$ has usually been formed because of interface oxidation, without generating any low-dielectric-constant layer. An interface strong even against the high-temperature process in an LSI forming process can be formed.

Furthermore, it is possible to form a high-resistance silicide regularly arranged on this insulating metal silicide. In this case, the localized states are generated in the band gap, and a semiconductor behavior is exhibited, not a metallic behavior. If a formed silicide exhibits the metallic behavior, resistance to oxidation gradually deteriorates, so that a usage range is largely limited. On the other hand, the resistance to oxidation is very high if the silicide stays in a stage in which the localized states are produced. Pinning of Fermi energy caused by using this high-resistance silicide enables to control the band offset between the Si substrate and the gate insulating film to be substantially equal both on a conduction band side and a valence electron band side. For example, even with $SrTiO_3$ or $TiO_2$ which has a high dielectric constant but which can hardly take a conduction band offset, the conduction band offset can be raised to 1.0 eV. When temperature and film forming speed are optimized, silicide can be regularly arranged, random scattering due to the interface localized states do not occur, and the mobility of a carrier does not drop.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate containing Si as a main component; and
   an active element formed on the semiconductor substrate and including an insulating metal suicide thin film formed on the semiconductor substrate, dangling bonds of Si of the semiconductor substrate being terminated by the insulating metal silicide thin film.

2. The semiconductor device according to claim 1, wherein the insulating metal suicide thin film includes $MSi_2$ whose element ratio of metal M to Si is 1:2, and the metal M is bivalent or quadrivalent.

3. The semiconductor device according to claim 2, wherein the metal M includes at least one element selected from the group consisting of Mg, Ca, Sr, Ba, Co, Ni, Pd, Pt, Cu, Ag, Zn, Ti, Zr, Hf, Ce, Mo, W, Ru, Os, and Ir.

4. The semiconductor device according to claim 2, wherein the active element is an MIS field-effect transistor including an insulating film formed on the insulating metal silicide thin film, and an electrode formed on the insulating film.

5. The semiconductor device according to claim 4, wherein the insulating film is formed of one selected from the group consisting of an oxide, a nitride, and an oxynitride.

6. The semiconductor device according to claim 1, wherein the insulating metal silicide thin film includes MSi whose element ratio of metal M to Si is 1:1, and the metal M is bivalent.

7. The semiconductor device according to claim 6, wherein the metal includes at least one element selected from the group consisting of Mg, Ca, Sr, Ba, Co, Ni, Pd, Pt, Cu, Ag, and Zn.

8. The semiconductor device according to claim 6, wherein the active element is an MIS field-effect transistor including an insulating film formed on the insulating metal silicide thin film and an electrode formed on the insulating film.

9. The semiconductor device according to claim 8, wherein the insulating film on the metal silicide thin film is formed of one selected from the group consisting of oxide, nitride, and oxynitride.

10. A semiconductor device comprising:
    a semiconductor substrate containing Si as a main component;
    an active element formed above the semiconductor substrate; and
    an insulating metal silicide thin film formed between the semiconductor substrate and the active element, so as to terminate dangling bonds of Si of the semiconductor substrate, the film including MSi whose element ratio of metal M to Si is 1:1,
    wherein the metal M is quadrivalent and includes at least one element selected from the group consisting of Ti, Zr, Hf, Ce, Mo, W, Ru, Os, and Ir.

11. The semiconductor device according to claim 10, wherein the active element is an MIS field-effect transistor including an insulating film formed on the insulating metal silicide thin film and an electrode formed on the insulating film.

12. The semiconductor device according to claim 11, wherein the insulating film is formed of one selected from the group consisting of an oxide, a nitride, and an oxynitride.

13. The semiconductor device according to claim 1, further comprising a high-resistance silicide film formed so as to have a reconstructed structure keeping periodicity on the insulating metal silicide thin film.

14. The semiconductor device according to claim 1, wherein the insulating metal silicide thin film is formed as one mono layer.

15. The semiconductor device according to claim 14, wherein the insulating metal suicide thin film includes a high-resistance suicide film formed so as to have a reconstructed structure keeping periodicity on the insulating metal suicide thin film.

16. The semiconductor device according to claim 10, further comprising a high-resistance suicide film formed so as to have a reconstructed structure keeping periodicity on the insulating metal silicide thin film.

17. The semiconductor device according to claim 10, wherein the insulating metal suicide thin film is formed as one mono layer.

18. The semiconductor device according to claim 17 wherein the insulating metal silicide thin film includes a high-resistance silicide film formed so as to have a reconstructed structure keeping periodicity on the insulating metal silicide thin film.

* * * * *

UNITED STATES PATENT AND TRADEMARK OFFICE
CERTIFICATE OF CORRECTION

PATENT NO. : 7,115,953 B2 Page 1 of 1
APPLICATION NO. : 11/049661
DATED : October 3, 2006
INVENTOR(S) : Shimizu et al.

It is certified that error appears in the above-identified patent and that said Letters Patent is hereby corrected as shown below:

Claim 1, column 18, line 2, change "suicide" to --silicide--.

Claim 2, column 18, line 8, change "suicide" to --silicide--.

Claim 15, column 19, line 5, change "suicide" to --silicide--.

Claim 15, column 19, line 6, change "suicide" to --silicide--.

Claim 15, column 19, line 8, change "suicide" to --silicide--.

Claim 16, column 19, line 10, change "suicide" to --silicide--.

Claim 17, column 20, line 2, change "suicide" to --silicide--.

Signed and Sealed this

Ninth Day of January, 2007

JON W. DUDAS
*Director of the United States Patent and Trademark Office*